(12) United States Patent
Van Haaster

(10) Patent No.: US 7,112,740 B2
(45) Date of Patent: Sep. 26, 2006

(54) SHIELDING STRIPS

(75) Inventor: Phil Van Haaster, Corona, CA (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 11/175,075

(22) Filed: Jul. 5, 2005

(65) Prior Publication Data

US 2006/0180347 A1 Aug. 17, 2006

Related U.S. Application Data

(63) Continuation-in-part of application No. 11/056,428, filed on Feb. 11, 2005.

(51) Int. Cl.
*H05K 9/00* (2006.01)

(52) U.S. Cl. .................................. 174/35 GC

(58) Field of Classification Search ........... 174/35 GC, 174/35 R; 361/816, 818; 277/920
See application file for complete search history.

(56) References Cited

U.S. PATENT DOCUMENTS

| | | | |
|---|---|---|---|
| 1,765,443 A | 6/1930 | Peterson | |
| 4,572,921 A | 2/1986 | May et al. | |
| 4,705,916 A | 11/1987 | Wadhera et al. | |
| 4,754,101 A | 6/1988 | Stickney et al. | |
| 4,864,076 A | 9/1989 | Stickney | |
| 5,001,297 A | 3/1991 | Peregrim et al. | |
| 5,029,254 A | 7/1991 | Stickney | |
| 5,120,903 A * | 6/1992 | Tam | 174/35 GC |
| 5,523,527 A | 6/1996 | Mann et al. | |
| 5,952,608 A | 9/1999 | Kim | |
| 5,957,465 A | 9/1999 | Gonsalves et al. | |
| 6,043,991 A * | 3/2000 | Sorrentino | 361/816 |
| 6,073,896 A | 6/2000 | McFadden | |
| 6,201,182 B1 | 3/2001 | Sosnowski | |
| 6,225,555 B1 | 5/2001 | Sosnowski | |
| 6,259,609 B1 | 7/2001 | Kurz | |
| 6,294,729 B1 | 9/2001 | Kaplo | |
| 6,320,120 B1 | 11/2001 | Van Haaster | |
| 6,323,419 B1 | 11/2001 | Toy | |
| 6,343,956 B1 | 2/2002 | Stickney | |
| 6,348,654 B1 | 2/2002 | Shang et al. | |
| 6,349,038 B1 | 2/2002 | Hailey | |
| 6,355,878 B1 | 3/2002 | Kim | |
| 6,451,374 B1 | 9/2002 | Watchko et al. | |
| 6,483,023 B1 * | 11/2002 | Jacques | 174/35 GC |
| 6,500,012 B1 | 12/2002 | Billenstein et al. | |
| 6,521,828 B1 | 2/2003 | Ariel | |
| 6,525,266 B1 * | 2/2003 | Ferland et al. | 174/35 GC |
| 6,534,706 B1 | 3/2003 | Rapp et al. | |

(Continued)

FOREIGN PATENT DOCUMENTS

GB 2184294 A 6/1987

(Continued)

OTHER PUBLICATIONS

Pages from Laird Technologies website accessed on Jan. 14, 2005; 17 pages.

(Continued)

*Primary Examiner*—Hung V. Ngo
(74) *Attorney, Agent, or Firm*—Harness, Dickey & Pierce, P.L.C.

(57) ABSTRACT

A shielding strip according to one aspect of the invention includes a generally longitudinally extending region and at least one generally transversely extending slot along the generally longitudinally extending region. The slot has at least one enlarged portion at about at least one predetermined area of high stress concentration.

27 Claims, 9 Drawing Sheets

U.S. PATENT DOCUMENTS

| | | | |
|---|---|---|---|
| 6,544,047 B1 * | 4/2003 | Moore | 439/95 |
| 6,744,641 B1 * | 6/2004 | Schnabel | 361/818 |
| 6,794,571 B1 * | 9/2004 | Barringer et al. | 174/35 GC |
| 6,822,879 B1 | 11/2004 | Rathnam et al. | |
| 6,946,598 B1 * | 9/2005 | Konshak | 174/35 GC |
| 2003/0218873 A1 | 11/2003 | Eromaki et al. | |

FOREIGN PATENT DOCUMENTS

WO     WO 02/32205     4/2002

OTHER PUBLICATIONS

Figure labeled Tech-Etch Symmetrical dated May 13, 2005.

* cited by examiner

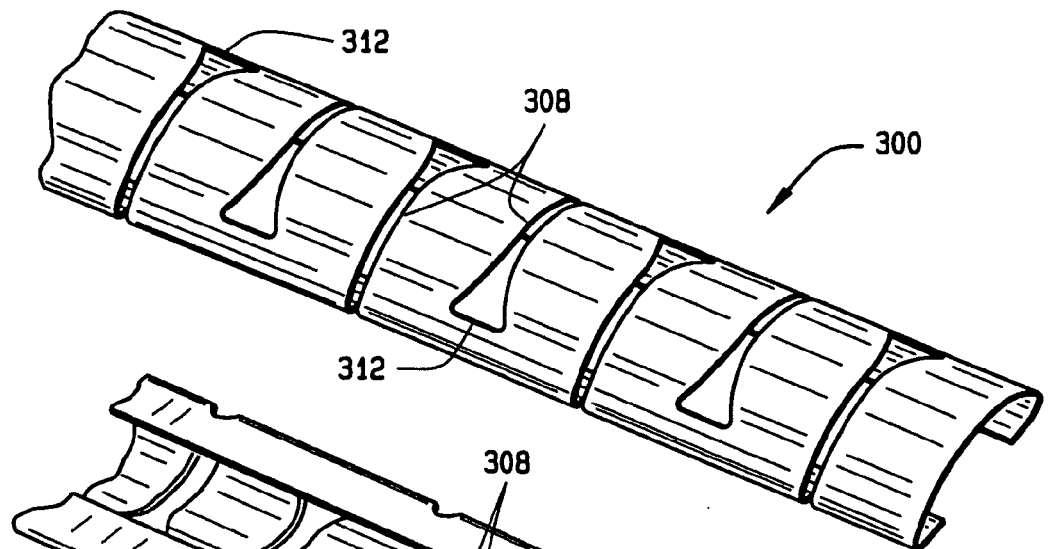
FIG. 11
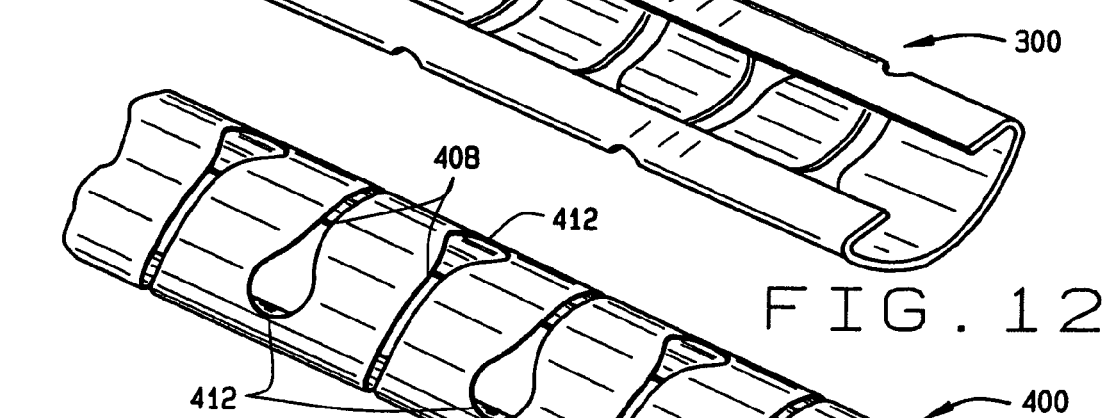
FIG. 12
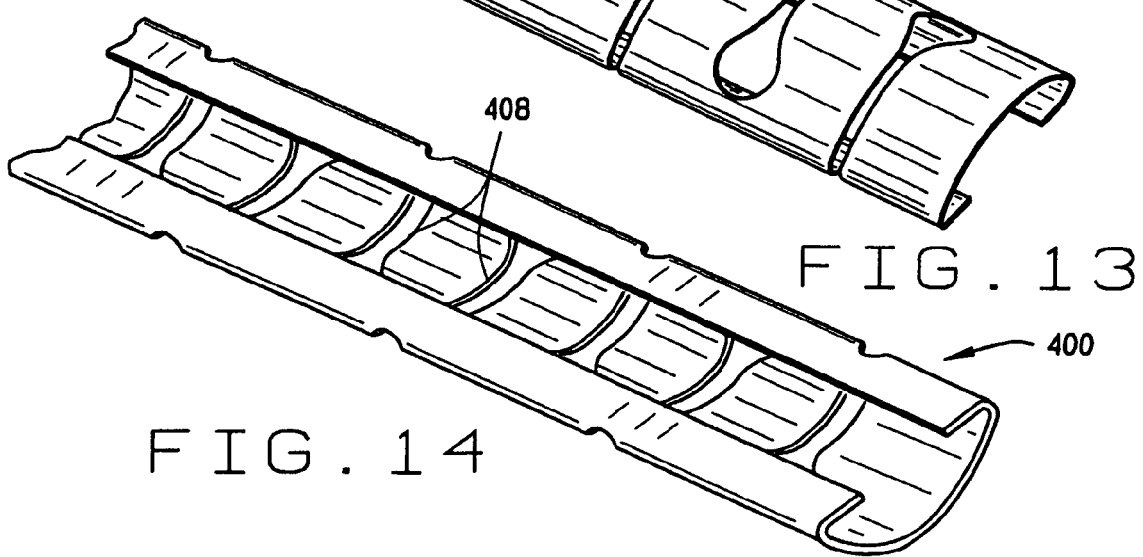
FIG. 13
FIG. 14

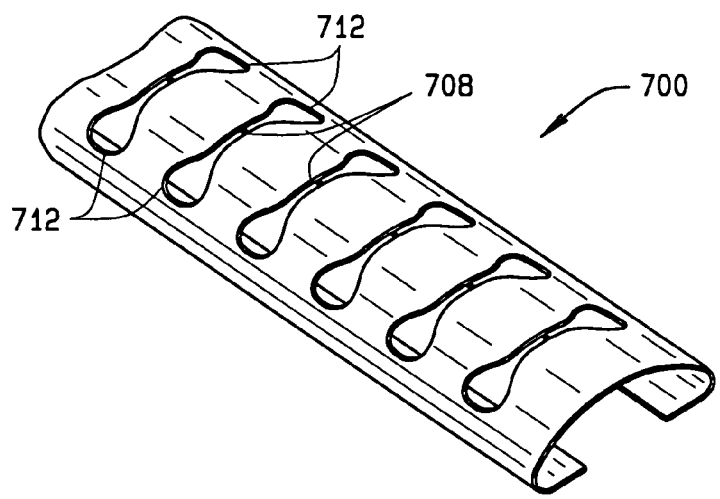
FIG. 21
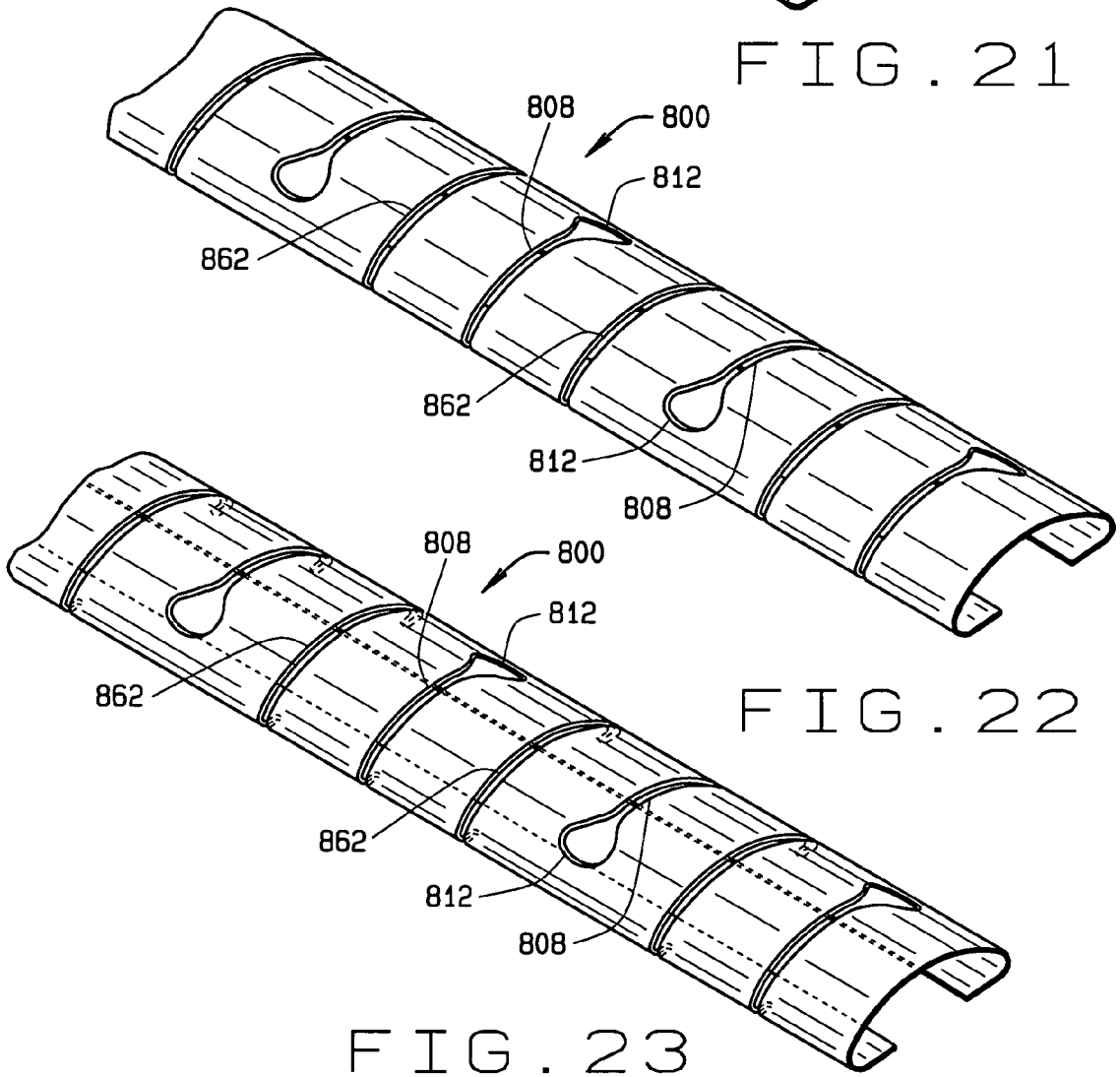
FIG. 22
FIG. 23

SHIELDING STRIPS

CROSS-REFERENCE TO RELATED APPLICATION

This application is a continuation-in-part of presently allowed U.S. patent application Ser. No. 11/056,428 filed on Feb. 11, 2005, the disclosure of which is incorporated herein by reference.

FIELD

The present invention generally relates to electromagnetic interference (EMI)/radio frequency interference (RFI) shielding devices, and more particularly (but not exclusively) to ruggedized ultrasoft shielding strips.

BACKGROUND

Selected electronic parts radiate electromagnetic waves, which can cause noise or unwanted signals to appear in electronic devices existing within a certain proximity of the radiating parts. Accordingly, it is not uncommon to provide shielding and/or grounding for electronic components that use circuitry that emits or is susceptible to electromagnetic radiation. These components can be shielded to reduce undesirable electromagnetic interference and/or susceptibility effects with the use of a conductive shield that reflects or dissipates the electromagnetic charges and fields. Such shielding may be grounded to allow the offending electrical charges and fields to be dissipated without disrupting the operation of the electronic components enclosed within the shield.

SUMMARY

According to one aspect of the present invention, a shielding strip generally includes a generally longitudinally extending region. The shielding strip also includes an array of generally transversely extending slots along the generally longitudinally extending region. At least some of the slots have a terminus with a larger cross section than the slot such that the terminuses having the larger cross section are at alternating ends of the slots.

A shielding strip according to another aspect of the present invention generally includes a generally longitudinally extending region. The shielding strip also includes at least one generally transversely extending slot along the generally longitudinally extending region. The slot has at least one enlarged portion at about at least one predetermined area of high stress concentration.

In another aspect, the present invention provides methods of making shielding strips. In one exemplary implementation, a method generally includes forming at least one generally transversely extending slot along a generally longitudinally extending region such that the slot includes at least one enlarged portion at about at least one predetermined area of high stress concentration.

In another exemplary implementation, a method generally includes forming an array of generally transversely extending slots along the generally longitudinally extending region such that at least some of the slots have a terminus with a larger cross section than the slot, which are at alternating ends of the slots.

Further aspects and features of the present invention will become apparent from the detailed description provided hereinafter. It should be understood that the detailed description and specific examples, while indicating exemplary embodiments of the invention, are intended for purposes of illustration only and are not intended to limit the scope of the invention.

BRIEF DESCRIPTION OF THE DRAWINGS

The invention will become more fully understood from the detailed description and the accompanying drawings, wherein:

FIG. 11 is a top perspective view of a shielding strip according to another exemplary embodiment of the invention;

FIG. 12 is a bottom perspective view of the shielding strip shown in FIG. 11;

FIG. 13 is a top perspective view of a shielding strip according to another exemplary embodiment of the invention;

FIG. 14 is a bottom perspective view of the shielding strip shown in FIG. 13;

FIG. 21 is a top perspective view of a shielding strip according to another exemplary embodiment of the invention;

FIG. 22 is a top perspective view of a shielding strip according to another exemplary embodiment of the invention; and FIG. 23 is another top perspective view of the shielding strip shown in FIG. 22.

DETAILED DESCRIPTION OF THE EXEMPLARY EMBODIMENTS

The following description of the exemplary embodiments is merely exemplary in nature and is in no way intended to limit the invention, its application, or uses.

Figure 1:
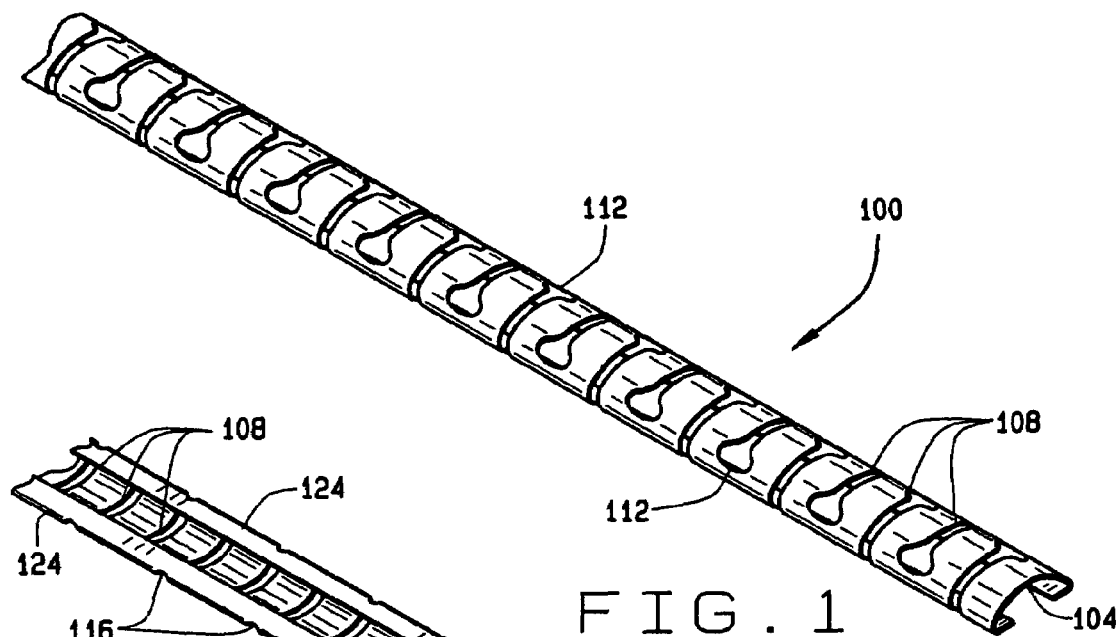
FIG. 1 is a top perspective view of a shielding strip according to one exemplary embodiment of the invention.
Figure 2:
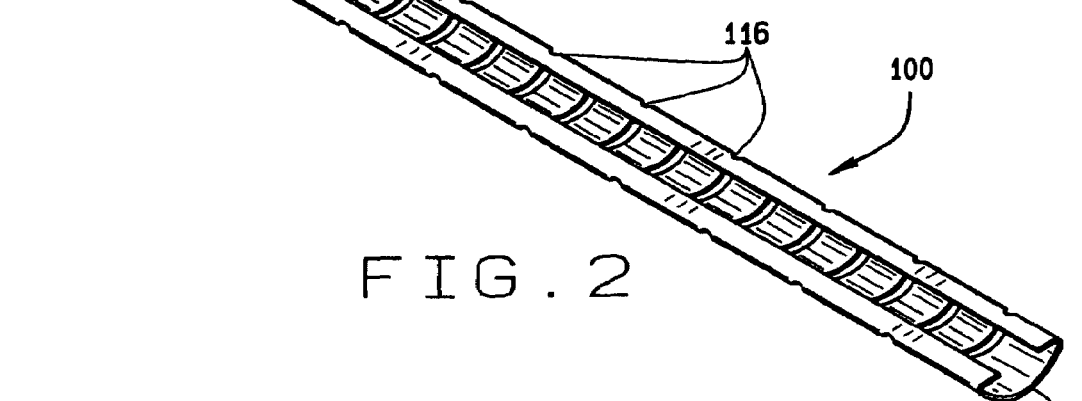
FIG. 2 is a bottom perspective view of the shielding strip shown in FIG. 1.

FIGS. 1 through 6 illustrate an exemplary shielding and/or grounding strip 100 in accordance with the principles of this invention. Hereinafter, shielding and/or grounding strip 100 will be referred to as shielding strip 100 even though shielding strip 100 may also or alternatively be used as a grounding strip. As shown in FIGS. 1 and 2, the shielding strip 100 includes a generally longitudinally extending region 104 and an array of generally transversely extending slots 108. Each slot 108 includes a terminus or end portion 112 with a larger cross section than the slot 108. In one exemplary embodiment, the terminuses or end portions 112 have a radius of curvature greater than the slot width. Preferably, the terminuses 112 are located at predetermined areas of high stress concentration, and are preferably configured (e.g., sized and shaped) to distribute high stress areas to low stress areas. This, in turn, helps reduce shear and normal contact loads when a contact surface 152 (FIG. 6) bears against the shielding strip 100.

Figure 5:
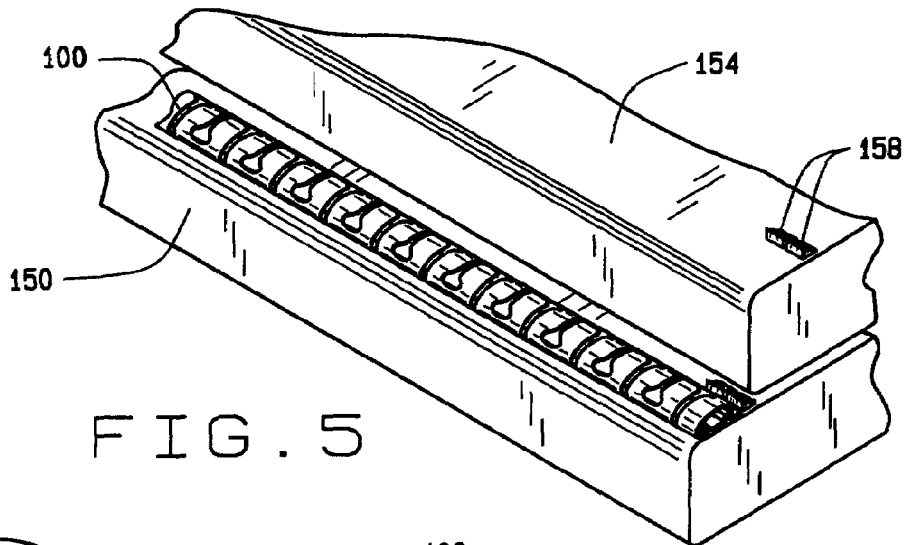
FIG. 5 is a top perspective view of the shielding strip shown in FIG. 1 positioned on a mounting surface.
Figure 6:
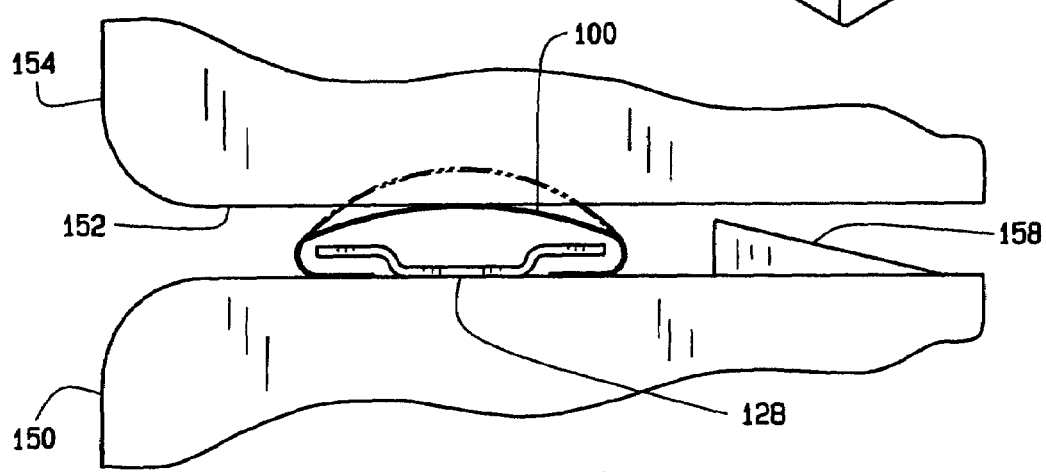
FIG. 6 is a side elevation view of the shielding strip shown in FIG. 5 with the shielding strip positioned between two components.

FIGS. 5 and 6 generally illustrate the importance of a soft contact load while maintaining a shear loadable component. In FIGS. 5 and 6, the shielding strip 100 is mounted on the rail 128. The shielding strip 100, however, has not yet been positioned between first and second components 150 and 154. FIG. 6 illustrates the shielding strip 100 after it has been positioned between the components 150 and 154 with the contact surface 152 abutting against the upper surface of the shielding strip 100. In FIG. 6, the dashed line represents the upper portion of the shielding strip 100 as shown in FIG. 5. The components 150 and 154 can include any of a wide range of components, such as slidable drawers. In one particular embodiment, the components 150 and/or 154 can be moved relative to one another so as to position the shielding strip 100 therebetween. That is, the first component 150 can be moved towards the second component 154 as the second component 154 remains stationary, or the second component 154 can be moved towards the first component 150 as the first component 150 remains stationary, or both components 150 and 154 can be moved towards each other.

By way of example only, FIGS. 5 and 6 also show generally triangular components 158 mounted to the components 150 and/or 154. These components can help maintain the gap or clearance between the components 150 and 154. Without a gap between the components 150 and 154, the relative sliding movement between the shielding strip 100 and the contact surface 152 might otherwise cause the contact surface 152 to snag and possibly damage the shielding strip 100.

In one particular embodiment, the shielding strip 100 has a length of about 14.194 inches with a tolerance of +/−0.060 inches, a width of about 0.325 inches with a tolerance of +/−0.015 inches, and a height of about 0.105 inches with a tolerance of +/−0.015 inches. These dimensions (as are all dimensions set forth herein) are for purposes of illustration only as the specific dimensions for a particular application can depend, for example, upon the length of the shielding strip, desired shielding effectiveness, material properties of the shielding strip, and particular installation (e.g., thickness of the mounting surface or rail on which the shielding strip will be positioned, etc.). In addition, the dimensions may vary as a function of location such that the shielding strip is thicker in one region than another to accommodate gaps of different thickness in the enclosure and connector locations. Accordingly, the dimensions of the shielding strip may be varied accordingly in order to achieve the desired contact.

Figure 3:
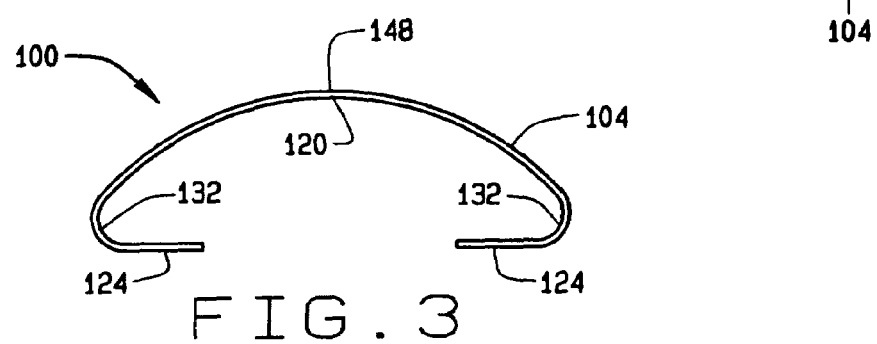
FIG. 3 is a side elevation view of the shielding strip shown in FIG. 1.

With reference now to FIG. 3, the region 104 is curved along a length of the shielding strip 100 such that the shielding strip 100 has a generally arcuate transverse or cross-sectional profile. That is, the shielding strip 100 has a substantially concave or semi-circular curvature across the top portion of the shielding strip 100. In one particular embodiment, the region 104 has a radius of curvature 120 of about 0.212 inches with a tolerance of +/−0.015 inches. Alternatively, the region 104 can be curved to have a lesser or greater radius of curvature depending on the particular application in which the shielding strip 100 will be used.

In various embodiments, providing the shielding strip 100 with a rounded or curved profile can help even out the load on the shielding strip 100 when the shielding strip 100 is being positioned between the components 150 and 154. By way of comparison to a shielding strip with a more triangular profile (such as the generally triangular profile shown in FIG. 17), peaks in the loading can develop as the ramp of one leg of the triangular profile contacts a surface (e.g., contact surface 152 in FIG. 6). At this point, continued pushing on the shielding strip against the contact surface can cause a peak in the loading until the midpoint of the triangular profile is reached and the load evens out. But a more rounded profile, such as that shown in FIG. 3 for the shielding strip 100, can help at least reduce any sudden spiking in the load when the shielding strip 100 is being slidably inserted between the components 150 and 154. This is because the more rounded profile allows for a more consistent load throughout the insertion motion. Alternatively, however, other suitable cross-sectional profiles can be employed.

The shielding strip 100 also includes longitudinally extending lateral edge regions or webs 124. As shown in FIG. 6, these edge regions 124 can be configured to be positioned generally around the mounting rail 128. In one particular embodiment, the edge regions 124 are formed (e.g., wrapped or bent, etc.) under the region 104 such that the edge regions 124 each have a width of about 0.075 inches with a tolerance of +/−0.005 inches, and a radius of curvature 132 (FIG. 3) of about 0.020 inches with a tolerance of +/−0.015 inches. The configuration (e.g., width, radius of curvature, etc.) of the edges regions 124 can vary depending, for example, on the particular application in which the shielding strip 100 will be used. Further, in other embodiments, the shielding strip 100 can additionally or alternative include other means for mounting the shielding strip 100 onto the rail 128.

Figure 7:
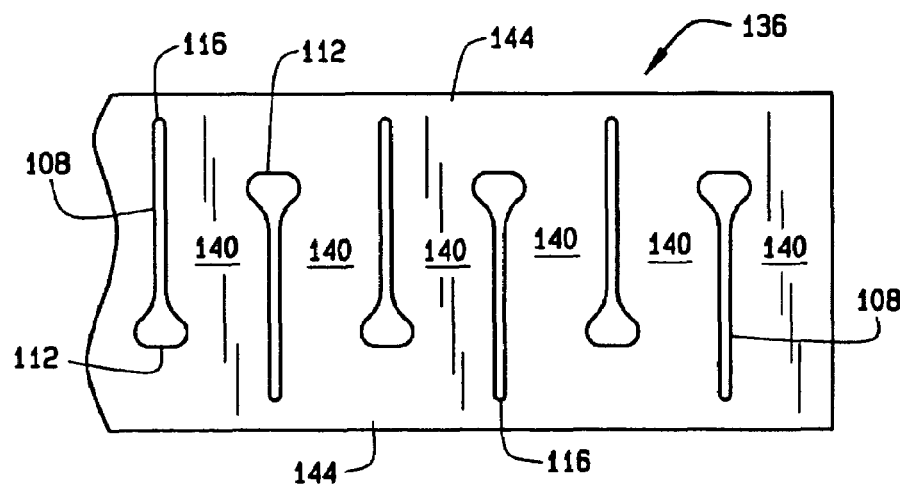
FIG. 7 is a plan view of the shielding strip blank prior to forming.

FIG. 7 illustrates a generally flat blank 136 of material from which the shielding strip 100 can be formed. As shown in the figures, the shielding strip 100 includes a plurality of slots 108 that define finger elements 140 therebetween. The slots 108 allow the finger elements 140 to flex outwardly and move relatively independently. In the illustrated embodiment, the slots 108 do not extend entirely across the shielding strip 100 such that a solid margin 144 is formed along each longitudinal side of the blank 136. The solid margin 144 along each side provides a continuous length of material along the length of shielding strip 100 and provides added rigidity to the shielding strip 100.

Figure 4:
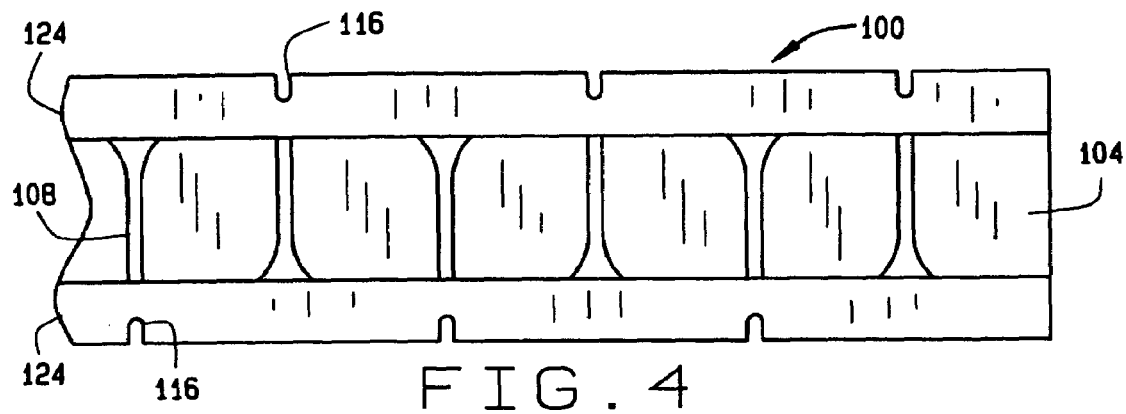
FIG. 4 is a bottom plan view of the shielding strip shown in FIG. 1.
Figure 8:
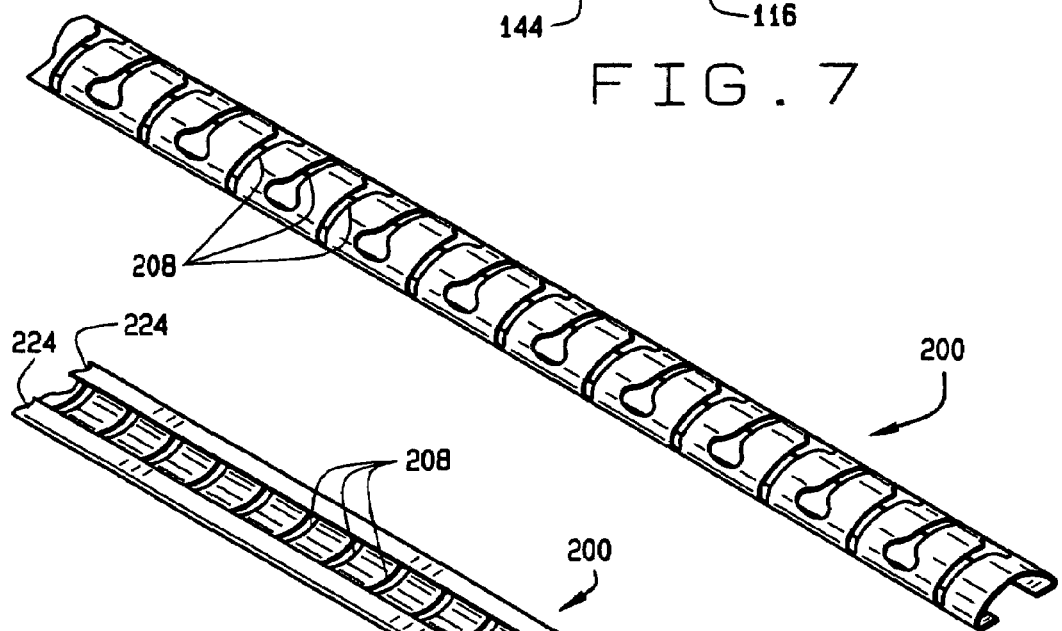
FIG. 8 is a top perspective view of a shielding strip according to another exemplary embodiment of the invention.
Figure 9:
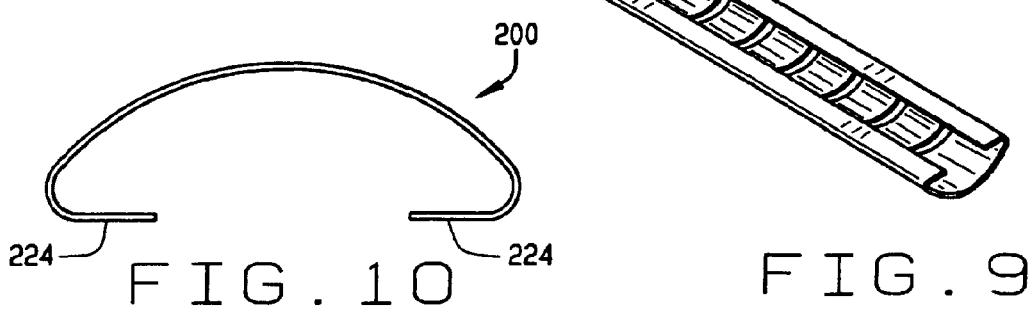
FIG. 9 is a bottom perspective view of the shielding strip shown in FIG. 8.
Figure 10:
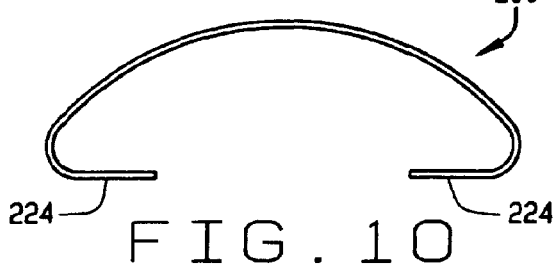
FIG. 10 is a side elevation view of the shielding strip shown in FIG. 8.

To improve flexibility of the shielding strip 100 and facilitate installation, each slot 108 includes a second terminus or end portion 116 that extends at least partially within the lateral edge regions 124, as shown in FIGS. 2 and 4. In this particular embodiment, the slots 108 alternatingly extend from the region 104 towards opposite sides of the shielding strip 100. Alternatively, the slots do not have to extend into the lateral edge regions. For example, FIGS. 7 through 9 illustrate an exemplary shielding strip 200 in which the slots 208 do not extend into the lateral edge regions 224. Further embodiments can include shielding strips that have slots that extend into both lateral edge regions. Still other embodiments can include shielding strips having slots that include at least one enlarged end portion that extends into a lateral edge region. Additional embodiments include shielding strips having at least one open-ended slot that extends completely through a lateral edge region.

With continued reference to FIGS. 1 through 6, one particular embodiment of the shielding strip 100 includes slots 108 each having a width of about 0.0180 inches with a tolerance of +/−0.003 inches. This particular shielding strip 100 also includes finger elements 140 having a width of about 0.169 inches with a tolerance of +/−0.003 inches. The size, shape, arrangement, orientation, and number of slots 108 and fingers 140 may be varied depending, for example, upon the length of the shielding strip, desired shielding effectiveness, material properties of the shielding strip, and particular installation (e.g., thickness of the mounting surface or rail on which the shielding strip will be positioned, etc.). Alternate embodiments of the shielding strip may, for example, include less than or more than the number of slots and fingers shown in the figures. Further embodiments may include other slot arrangements and orientations besides transversely extending slots shown in the figures.

In the particular illustrated embodiment, each slot 108 includes only one enlarged terminus 112. The other end or terminus 116 of each slot 108 does not have a cross-section that is larger than the cross-section of the slot 108. In alternative embodiments, however, the slots can include enlarged terminuses at both ends. For example, FIG. 21 illustrates an exemplary shielding strip 700 having slots 708. Each slot 708 includes an enlarged substantially bulbous terminus 72 at each end of the slot 708. In yet other embodiments, one or more of the slots may not have any enlarged terminuses. For example, FIGS. 22 and 23 illustrate an exemplary shielding strip 800 having slots 808 with enlarged end portions 812. The shielding strip 800 also includes other slots 862 that have a substantially uniform cross-section disposed between the slots 808. In still other embodiments, one or more of the slots can additionally or alternatively include enlarged portions at other locations (e.g., at other predetermined areas of high stress concentration) besides the end portions.

In the illustrated embodiment, the enlarged portions 112 are located at alternating ends of the slots 108. As described earlier, the rounded profile of the shielding strip 100 helps to distribute the stress load evenly when the shielding strip 100 is being slidably positioned between the components 150 and 154. By removing the surface area from the slot end portions which are associated with high stress concentrations, the enlarged terminuses 112 distribute high stress areas to low stress areas. This, in turn, helps reduce shear and normal contact loads created by the contact surface 152 bearing on the shielding strip 100.

A wide range of shapes can be employed for the enlarged terminuses 112. In the illustrated embodiment, the enlarged terminuses 112 are substantially teardrop shaped or bulbous. Alternatively, other shapes may be employed for the enlarged terminuses 112 such as triangular, rectangular, circular, ovular, arrowhead shaped, combinations thereof, among others.

For example, FIGS. 11 and 12 illustrate an exemplary shielding strip 300 having slots 308. Each slot 308 has an enlarged terminus 312 that is generally triangularly shaped such that the enlarged terminuses are at alternating ends of the slots 308.

FIGS. 13 and 14 illustrate an exemplary shielding strip 400 having slots 408. Each slot 408 includes an enlarged substantially bulbous terminus 412.

Figure 15:
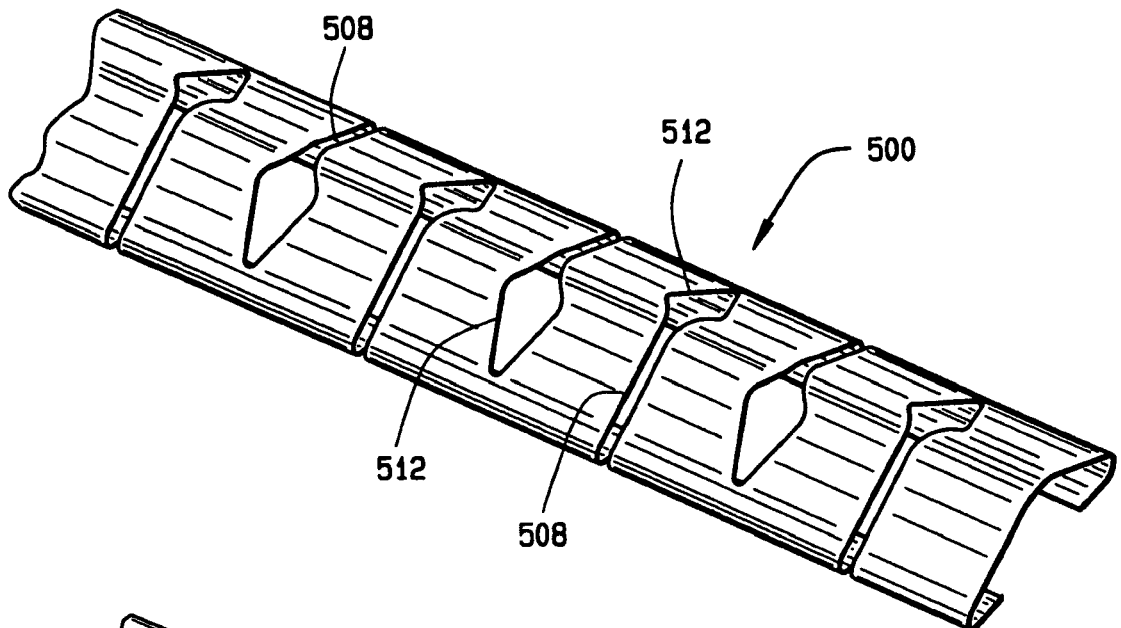
FIG. 15 is a top perspective view of a shielding strip according to another exemplary embodiment of the invention.
Figure 16:
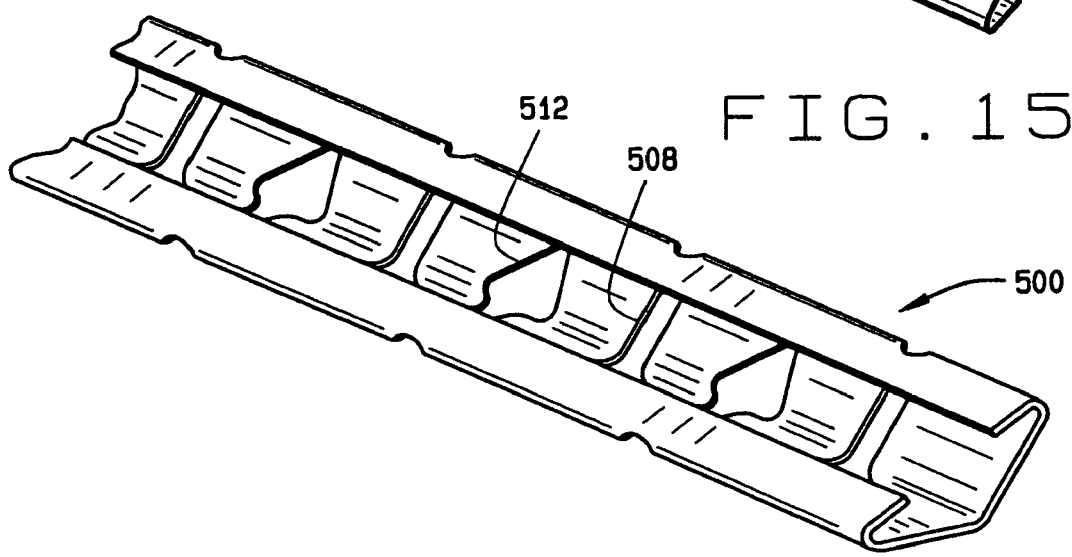
FIG. 16 is a bottom perspective view of the shielding strip shown in FIG. 15.
Figure 17:
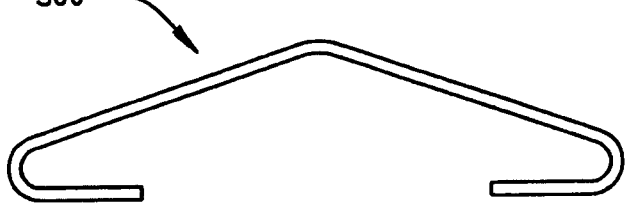
FIG. 17 is a side elevation view of the shielding strip shown in FIG. 15.

FIGS. 15 through 17 illustrate an exemplary shielding strip 500 having slots 508. Each slot 508 includes an enlarged terminus 512 that is generally shaped as an arrowhead. In this particular embodiment, the shielding strip 500 also includes a generally triangular cross-sectional profile as shown in FIG. 17. In various embodiments, the slot cross-section may be modified to accommodate the resulting high stress areas or load peaks that can occur when slidably positioning the shielding strip between components as described above.

The particular shape, size, and location for the enlarged portions of the slots can be tailored to the specific profile of the shielding strip and/or application in which the shielding strip will be used. In addition, the same shape need not be used for each enlarged portion of the slots.

A wide range of materials, preferably resiliently flexible and electrically conductive, can be used for a shielding strip (e.g., 100, 200, 300, 400, 500, etc.) of the present invention. In various embodiments, the shielding strip is formed from resiliently flexible material that is elastic in nature with a modulus of elasticity sufficient so that the shielding strip and/or the finger elements can be displaced by a force from an unloaded position to a loaded position, and will return to the unloaded position upon the removal of this force without exceeding the yield point of the material. Additionally, or alternatively, the shielding strip in some embodiments is formed from an electrically conductive material capable of conducting electricity therethrough and that has an impedance low enough to be an effective EMI/RFI shield.

By way of further example, one embodiment includes a shielding strip being formed from a beryllium copper alloy (e.g., beryllium copper alloy 25, etc.) or stainless steel. The beryllium copper alloy may include between about 1.8% (weight) and about 2.0% (weight) beryllium, a maximum of about 0.6% (weight) of the combination of cobalt, nickel, and iron, and the balance copper, which alloy has an electrical conductivity of between about 22% and about 28% IACS (International Annealed Copper Standard). An example of a suitable alloy is available from Brush Wellman, Cleveland, Ohio, as Brush Alloy 25 (copper alloy UNS number C17200).

Other suitable materials can also be used such as phosphor bronze, copper-clad steel, brass, monel, aluminum, steel, nickel silver, other beryllium copper alloys, among others. Furthermore, the material can optionally be pre-plated or post-plated for galvanic compatibility with the surface on which it is intended to be mounted. Alternatively, the material can be a molded or cast polymer that is loaded or coated to be electrically conductive.

The shielding strip 100 can be used as a shielding and/or grounding strip by contacting another surface which would bear against finger elements 140 and a top portion 148 of the shielding strip 100 with a force which has a component perpendicular to a longitudinal axis of the shielding strip 100. In use, the finger elements 140 and top portion 148 can be borne against by another surface causing the finger elements 140 to flex along their length, thus bringing top portion 148 closer to the mounting surface 128, as shown in FIG. 6.

When the loading surface is removed from being in contact with shielding strip 100, the resilient nature of the material out of which the shielding strip 100 and/or finger elements 140 are constructed allows the finger elements 140 to return to their unloaded position, as shown in FIG. 5. The material from which the shielding strip 100 is constructed can be selected so that during use of the shielding strip 100 as a shielding and/or grounding strip, the yield point of the material is not reached and no plastic deformation of the material occurs.

In another form, the present invention also provides methods of making shielding strips. In one exemplary implementation, the method includes forming at least one generally transversely extending slot along a generally longitudinally extending region such that the slot includes at least one enlarged portion at about at least one predetermined area of high stress concentration.

By way of example, the predetermined area(s) of high stress concentration can be found with computational modeling using non-linear finite element analysis. Alternatively, other computational modeling can be employed to find predetermined area(s) of high stress concentration.

Figure 18:
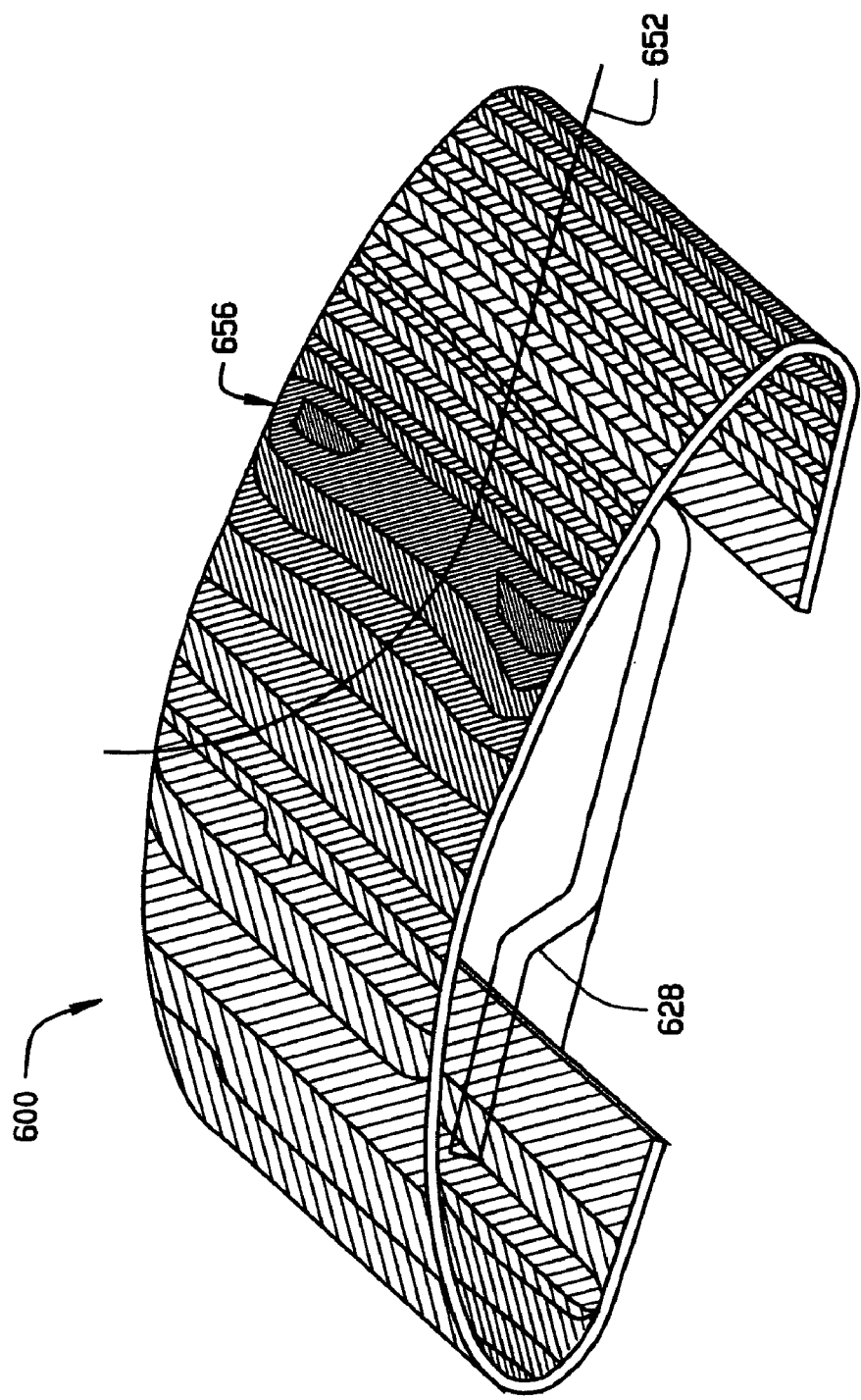
FIG. 18 is a computational model illustrating stresses concentrations caused by a contact surface bearing against a shielding strip according to one exemplary embodiment of the invention.
Figure 18:
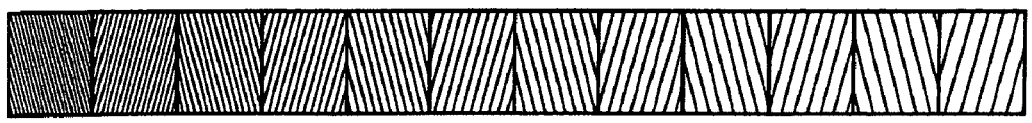

FIG. 18 illustrates a computational model showing stress concentrations determined by using non-linear finite element analysis. These stress concentrations are created by the contact surface 652 bearing against the shielding strip 600 mounted on the rail 628. The legend (shown on the left in FIG. 18) shows stress concentrations decreasing in magnitude from the top to the bottom of the legend. In this particular example, the computational model of the shielding strip 600 includes a generally arcuate transverse or cross-sectional profile, and slots having a substantially uniform cross-section. Accordingly, the slots in the computational model did not include enlarged end portions.

As shown in FIG. 18, the area generally designated 656 represents high stress concentration as compared to other areas of the model of the shielding strip 600. Now that the area of high stress concentration has been determined, the cross-section of the slots may be adjusted so as to distribute the high stress concentrations to areas of lower stress concentration. For example, in various embodiments, the slot's cross section is made larger where the computational modeling suggests that high stress concentrations 656 will occur. By distributing the high stress concentrations to areas of lower stress concentration, the adjustments to the slot cross-section can help prevent the shielding strip from experiencing plastic deformation at the high stress areas. But whether plastic deformation would occur, however, would depend at least partially on the particular material(s) and other attributes of the shielding strip.

Figure 19:
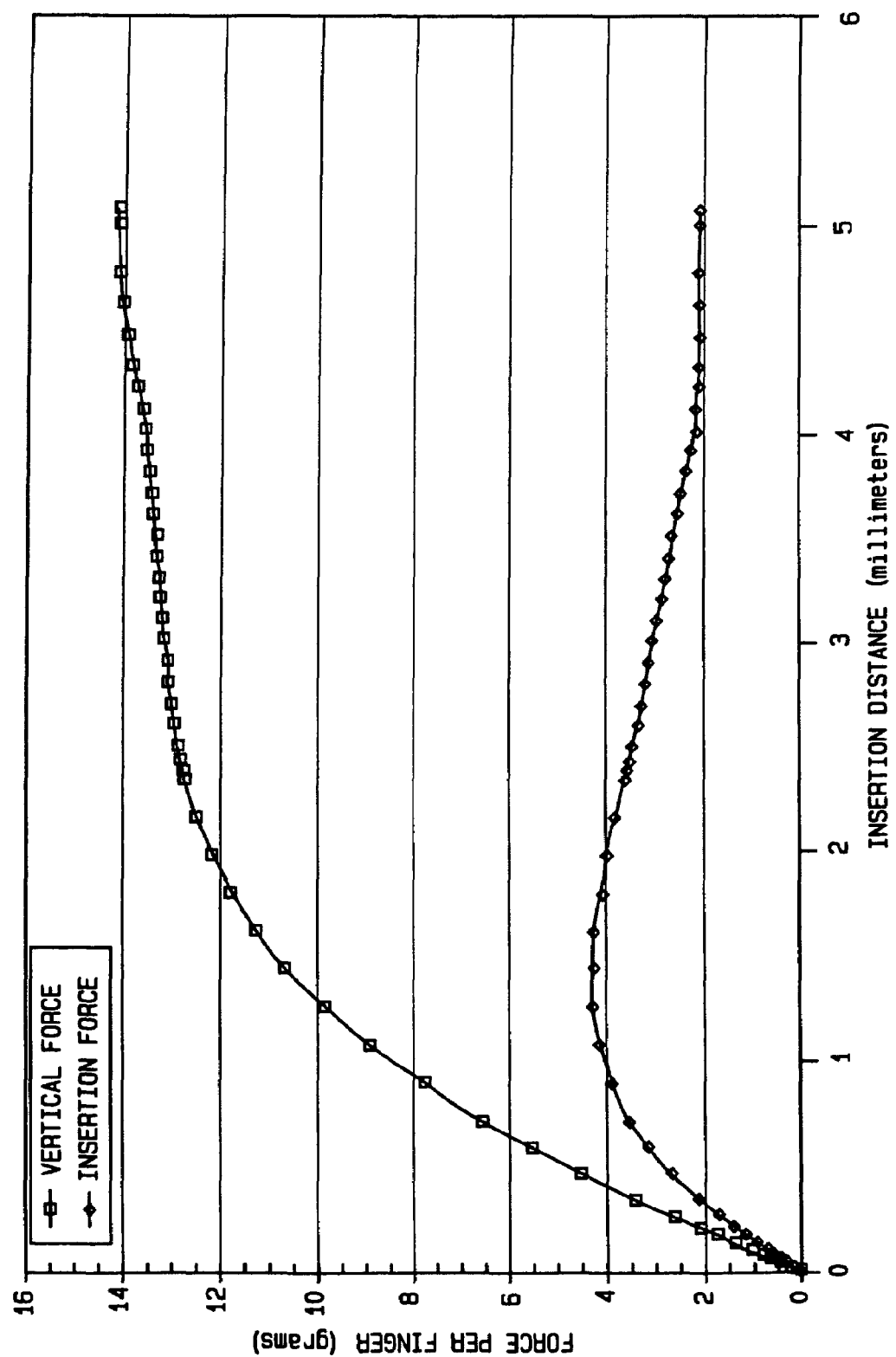
FIG. 19 is an exemplary line graph of force per finger versus insertion distance for the shielding strip shown in FIG. 1.

FIG. 19 is an exemplary line graph of force per finger versus insertion distance for the shielding strip 100 (FIGS. 1 through 6) when the coefficient of friction was 0.15. FIG. 19 plots insertion force or shear load on the shielding strip fingers 140 versus insertion distance. FIG. 19 also plots vertical force or normal load applied by the contact surface 152 bearing down against the shielding strip fingers 140 versus insertion distance. In this particular example, insertion distance refers to the distance that the shielding strip 100 has been slidably positioned under the contact surface 152. The shielding strip 100 can be positioned under the contact surface 152 by moving the components 150 and 154 relative to one another so as to position the shielding strip 100 therebetween. That is, the first component 150 can be moved towards the second component 154 as the second component 154 remains stationary, or the second component 154 can be moved towards the first component 150 as the first component 150 remains stationary, or both components 150 and 154 can be moved towards each other.

Figure 20:
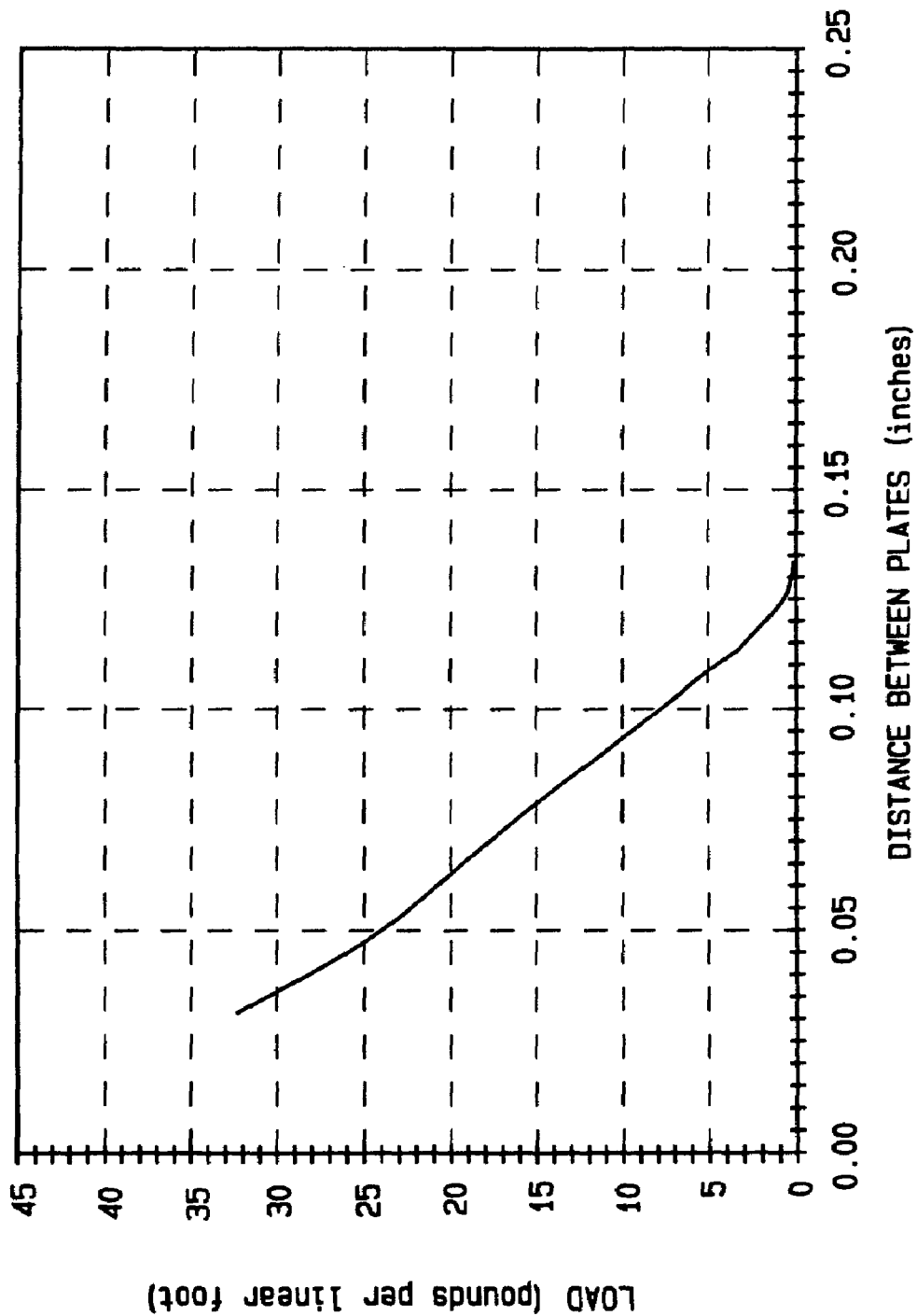
FIG. 20 is an exemplary line graph showing load on the shielding strip versus distance between a mounting surface and a contact surface bearing against the shielding strip shown in FIG. 1.

FIG. 20 is an exemplary line graph showing load on the shielding strip 100 (FIGS. 1 through 6) versus distance between the plates. In this particular example, the shielding strip 100 was formed from tin plated beryllium copper. The distance between the plates generally refers to the gap separating the component 150 from the contact surface 152 (FIGS. 5 and 6).

The values plotted in FIGS. 19 and 20 are for illustrative purposes only and not for purposes of limitations. In other embodiments, these values may be different depending, for example, on the particular shielding strip and its material, transverse or cross-sectional profile, and/or slot arrangement.

Accordingly, various embodiments of the present invention provide shielding strips that are sufficiently strong and rigid to make good electrical contact, resist damage, and withstand forces generated in use without detaching from the mounting surface. These embodiments are also sufficiently soft and flexible enough to be relatively easily installed in a wide range of applications, such as limited space applications, front panel handles, plug-in-units, sub-track assemblies, chassis covers and backplanes.

By removing surface area in locations of high stress concentration to distribute high stress areas to low stress areas, various embodiments provide low shear contact shielding strips that can also provide near continuous EMI contact.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A shielding strip including a generally longitudinally extending region, generally longitudinally extending lateral edge regions disposed under the generally longitudinal extending region, and an array of generally transversely extending slots along the generally longitudinally extending region, at least some of said slots having a terminus with a larger cross section than said slot such that the terminuses with the larger cross section are at alternating ends of the slots.

2. The shielding strip of claim 1, wherein at least one of said terminuses with the larger cross section has a radius of curvature greater than the slot width.

3. The shielding strip of claim 1, wherein the terminuses with the larger cross section alternatingly extend from the generally longitudinally extending region towards opposite sides of the shielding strip.

4. The shielding strip of claim 1, wherein at least one of said terminuses with the larger cross section is substantially teardrop shaped or substantially bulbous.

5. The shielding strip of claim 1, wherein at least one of said slots includes a terminus that is not larger in cross section than said slot and that extends at least partially within at least one of the lateral edge regions.

6. The shielding strip of claim 1, wherein the terminuses with the larger cross section are configured to distribute high stress areas to low stress areas.

7. The shielding strip of claim 1, wherein at least of said slots includes only one terminus having a larger cross section than said slot.

8. The shielding strip of claim 1, wherein at least one of said slots includes more than one terminus having a larger cross section than said slot.

9. The shielding strip of claim 1, wherein the shielding strip includes at least one slot with a substantially uniform cross section.

10. The shielding strip of claim 1, wherein the slots define finger elements therebetween, said finger elements configured for flexing generally outwardly and moving relatively independently from one another.

11. An electronic device including the shielding strip of claim 1.

12. A shielding strip including a generally longitudinally extending region and an array of generally transversely extending slots along the generally longitudinally extending region, at least some of said slots having a terminus with a larger cross section than said slot such that the terminuses with the larger cross section are at alternating ends of the slots, wherein the generally longitudinally extending region has a generally arcuate transverse profile.

13. A shielding strip including a generally longitudinally extending region and an array of generally transversely extending slots along the generally longitudinally extending region, at least some of said slots having a terminus with a larger cross section than said slot such that the terminuses with the larger cross section are at alternating ends of the slots, wherein the shielding strip includes a generally triangular shaped transverse profile.

14. A shielding strip including a generally longitudinally extending region, generally longitudinally extending lateral edge regions disposed under the generally longitudinal extending region, and at least one generally transversely extending slot along the generally longitudinally extending region, the slot having at least one enlarged portion with a larger cross section than said slot at about at least one predetermined area of high stress concentration.

15. The shielding strip of claim 14, wherein the at least one enlarged portion is at an end portion of the at least one slot.

16. The shielding strip of claim 14, wherein the at least one slot includes an array of generally transversely extending slots each having at least one enlarged portion at a predetermined area of high stress concentration.

17. The shielding strip of claim 16, wherein the enlarged portions are at alternating ends of the slots.

18. The shielding strip of claim 16, wherein at least one of said slots includes only one enlarged portion.

19. The shielding strip of claim 14, wherein the shielding strip includes at least one slot with a substantially uniform cross section.

20. The shielding strip of claim 14, wherein the at least one slot includes an end portion that extends at least partially within at least one of the lateral edge regions.

21. The shielding strip of claim 14, wherein the at least one enlarged portion has a radius of curvature greater than the slot width.

22. The shielding strip of claim 14, wherein the at least one enlarged portion is substantially teardrop shaped or substantially bulbous.

23. The shielding strip of claim 14, wherein the generally longitudinally extending region has a generally arcuate transverse profile.

24. The shielding strip of claim 14, wherein the at least one enlarged portion is configured to distribute stress associated with the predetermined area of high stress concentration to a predetermined area of low stress concentration.

25. An electronic device including the shielding strip of claim 14.

26. A shielding strip including a generally longitudinally extending region and at least one generally transversely extending slot along the generally longitudinally extending region, the slot having at least one enlarged portion with a larger cross section than said slot at about at least one predetermined area of high stress concentration, wherein the shielding strip includes a generally triangular shaped transverse profile.

27. A shielding strip including a generally longitudinally extending region and at least one generally transversely extending slot along the generally longitudinally extending region, the slot having at least one enlarged portion with a larger cross section than said slot at about at least one predetermined area of high stress concentration, wherein the at least one slot includes an array of generally transversely extending slots each having at least one enlarged portion at a predetermined area of high stress concentration, wherein at least one of said slots includes more than one enlarged portion.

* * * * *